United States Patent [19]

Madau et al.

[11] Patent Number: 5,136,275
[45] Date of Patent: Aug. 4, 1992

[54] GROUND CONNECTION MONITORING FOR AIRBAG ELECTRICAL IGNITER CIRCUIT

[76] Inventors: Adrian Madau, 5658 Fordham Cir., Canton, Mich. 48187; Robert J. Vrabel, 3393 Lords, Sterling Heights, Mich. 48310; John G. Glynn, 31170 W. Chicago, Livonia, Mich. 48150

[21] Appl. No.: 653,198

[22] Filed: Jan. 28, 1991

[51] Int. Cl.$^5$ .............................................. B60Q 1/00
[52] U.S. Cl. ..................................... 340/438; 340/436; 340/511; 340/514; 340/663; 280/735
[58] Field of Search ............... 340/436, 438, 507, 508, 340/511, 650, 663, 662, 644, 514; 280/735

[56] References Cited

U.S. PATENT DOCUMENTS 4,410,875 10/1983 Spies .................................. 280/735
4,862,091 8/1989 Hillebrand ......................... 340/436

Primary Examiner—Jin F. Ng
Assistant Examiner—Christine K. Oda
Attorney, Agent, or Firm—Paul K. Godwin, Jr.; Roger L. May

[57] ABSTRACT

Method and apparatus for periodically checking the ground path resistance value of a crash sensor connection to chassis ground and determining if the resistance exceeds a predetermined maximum acceptable value.

8 Claims, 2 Drawing Sheets

GROUND CONNECTION MONITORING FOR AIRBAG ELECTRICAL IGNITER CIRCUIT

BACKGROUND OF THE INVENTION

1. Field of the Invention

The present invention is directed to field of automotive airbag deployment systems and more specifically to the area of diagnostic systems for detecting faults within the airbag deployment circuit.

2. Background Information

As discussed in commonly assigned U.S. Pat. Nos. 4,359,715 and 4,366,465 (incorporated herein by reference), it is important to provide a diagnostic subsystem for an airbag deployment system that continually checks the continuity of the ignitor circuit which comprises the wiring harness, electrical connectors, various crash sensors and electrically responsive explosive igniters (squibs). The igniters are conventionally wired to associated electrical connectors that provide shorting paths around the igniters when the connectors are disconnected (unmated). Such shorting insures that voltages induced into the wiring of a disconnected igniter will not accidentally energize the igniter and cause accidental airbag deployment. The diagnostic systems of the aforementioned patents sense for shorts and alarm the vehicle operator to warn of disconnected connectors and other faults which would constitute an inoperable system.

In such diagnostic systems, each crash sensor switch is shunted by a known resistance value and the electrical igniter constitutes a known resistance value. The diagnostic systems provide low current through the igniter and crash sensor circuit and detect changes in voltage levels that appear at critical points.

In commonly assigned U.S. Pat. No. 4,893,109 (also incorporated herein by reference) an igniter resistance detector is described. In laboratory tests, it was found that some airbag deployment igniter elements may suffer chemical changes that cause resistance to change from a normally 1 ohm value to a value in excess of 4 ohms. When an igniter element's resistance value degrades to that level, there is a potential that, in the event a crash actuated deployment is required, the normal actuation voltage applied to the igniter will result in below-threshold current that will fail to cause the igniter to explode. A predetermined low energy electrical pulse is periodically applied to the igniter. The duration and value of the pulse are selected so that, when added to the constant diagnostic current through the igniter, the total current will still remain well below that threshold sufficient to trigger the igniter element. During the pulse, the voltage drop across the igniter is detected and compared with values that are predetermined as being within an acceptable range. In the event the igniter resistance has increased beyond an acceptable value, a warning is then provided to the vehicle operator so that appropriate service, such as replacement of the igniter element, can be obtained.

SUMMARY OF THE INVENTION

While the above-mentioned diagnostic systems are adequate for sensing integrity and changes in some resistance values, they are not effective in detecting small changes of resistance that may occur in the ground return line from the individual crash sensors. The crash sensors are normally bolted to the electrically conducting chassis of the vehicle which serves as the ground path return line in the electrical system. The connection between the crash sensors and the chassis ground is normally made in such a way that the resistance at the connection is essentially zero. However, in the event of a faulty connection, loosening over time, or corrosion, the ground connection resistance may increase to a level that would lower the current flow and prevent the igniter from reactively exploding when the crash actuated deployment is required.

In the present invention, a known current is passed through the portion of the crash sensor connected to ground and the resistance of that connection is detected, measured and compared with a predetermined acceptable maximum value to determine whether or not a fault exists in the system.

It is, therefore, an object of the present invention to supplement an airbag electrical igniter readiness detector which functions alongside a connection integrity diagnostic system by providing a periodic determination that the ground connection has a resistance value below a predetermined value.

It is another object of the present invention to provide an apparatus that periodically provides a controlled duration pulse of current to the ground return line of crash sensor in an air bag deployment system while measuring the corresponding voltage drop to determine if the system is ready to deploy.

DESCRIPTION OF THE PREFERRED EMBODIMENT

Figure 1:
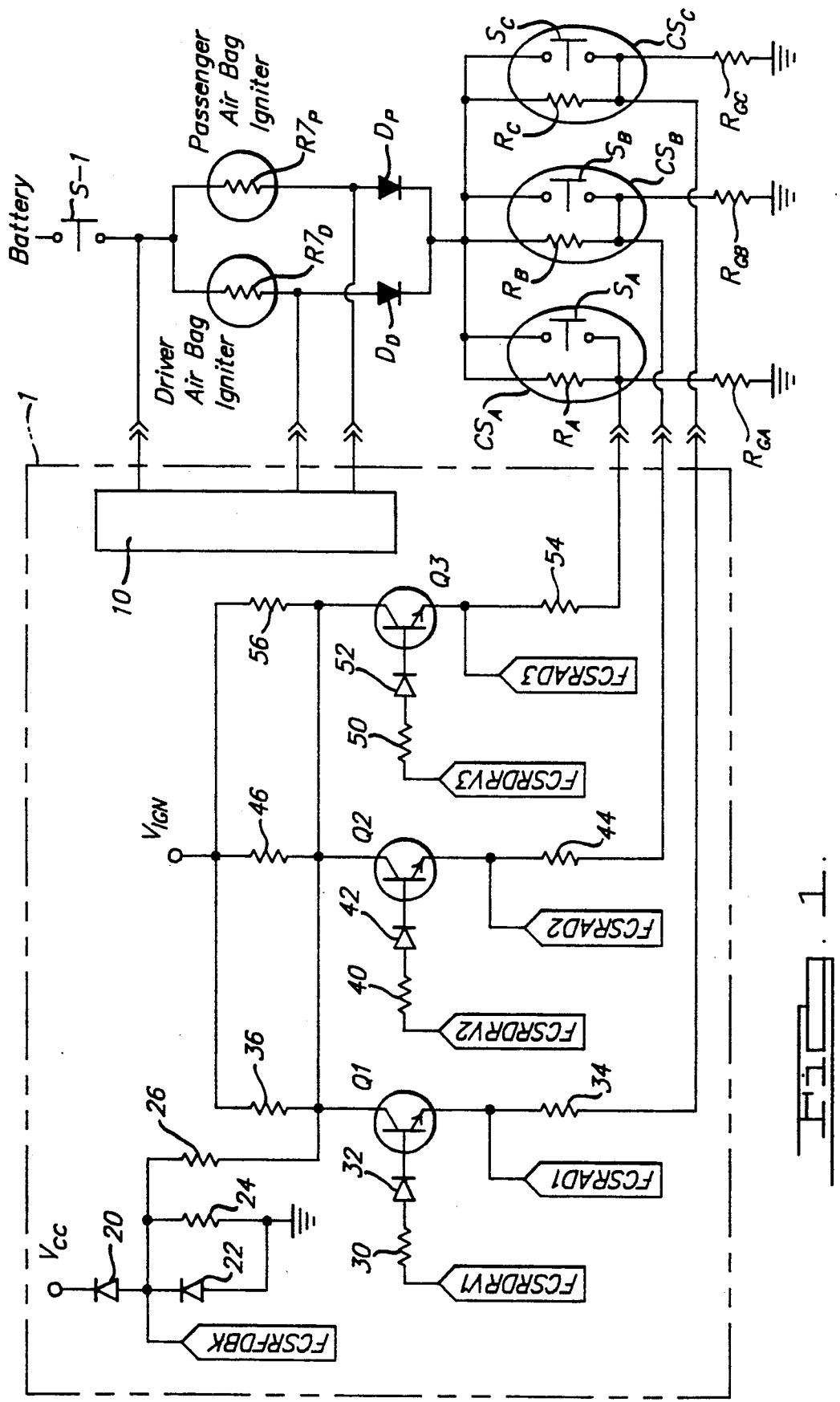
FIG. 1 is a schematic diagram illustrating components employed to implement the present invention.

FIG. 1 constitutes a simplified schematic of the crash sensor and airbag igniter portions of an airbag deployment system of the type shown in the commonly assigned patents mentioned above. Power is supplied from a vehicle electrical source such as a battery (or alternator/generator) to a normally open deceleration sensor switch S-1. A driver airbag igniter element (commonly called a "squib") has a resistance value $R7_D$ that is normally on the order of 1 ohm. Similarly, a passenger airbag igniter element has a resistance value $R7_P$ that is also on the order of 1 ohm. One side of the driver airbag igniter and the passenger airbag igniter are commonly connected to the switch S-1. The anode of a diode $D_D$ is connected in series with the other side of driver airbag igniter resistance $R7_D$; and the anode of a diode $D_P$ is connected in series with the other side of passenger airbag igniter resistance $R7_P$. The cathodes of the diodes $D_D$ and $D_P$ are commonly connected to a plurality of crash sensors $CS_A$, $CS_B$ and $CS_C$ which respectively contain a normally open crash sensor switch $S_A$, $S_B$ and $S_C$. In addition, the crash sensors respectively contain shunt resistors $R_A$, $R_B$ and $R_C$ connected in parallel between the cathodes of the diodes $D_D$ and $D_P$ and the return ground path.

Although each crash sensor is separately connected to the ground return path, a ground resistance ($R_{GA}$, $R_{GB}$ and $R_{GC}$) is shown as being associated with the connection of each of the crash sensors $CS_A$, $CS_B$ and $CS_C$. It is preferable, of course, that those ground resistances be at zero values but it is recognized they may reach some finite value which could affect the overall current capable of flowing in the corresponding airbag igniters if the circuit is completed. The present invention ensures that the resistance values of $R_{GA}$, $R_{GB}$ or $R_{GC}$ are each below the predetermined maximum allowable resistance values, on the order of 2 ohms.

The monitoring module 1 contains a readiness detector module 10 that preferably incorporates the circuits described in the aforementioned commonly assigned patents. The readiness detector module 10 includes a microcomputer which is programmed to perform the resistance checks on the airbag igniter elements and the continuity checks of the diagnostic system. The remaining circuit in the monitoring module 1 implements the present invention and is controlled by a microcomputer such as that which would be included in the readiness detector module 10 to provide the ground return path resistance checks for the crash sensors. In that circuit, three separate switching circuits, which respectively include Darlington transistors Q1, Q2 and Q3, are controllable to provide a high current pulse from the $V_{IGN}$ current source to a point on the respective crash sensors immediately above their ground connections. Parallel connected resistors 36, 46 and 56 serve as current limiters for the individually controlled switches Q1, Q2 and Q3. A voltage divider made up of resistors 26 and 24 is connected in common with the collectors of transistors Q1, Q2 and Q3 and provides a feedback voltage to the associated microcomputer (not shown) on its FCSRFDBK terminal. Diodes 20 and 22 are connected in series between $V_{CC}$ terminal and ground to provide transient protection to the microcomputer at the FCSRFDBK terminal.

Since each of the three ground connection measuring circuits are identical, the following description is only directed to Q1. That description equally applies to the circuits which incorporate transistors Q2 and Q3.

In the first switching circuit incorporating transistor Q1, the collector of Q1 is connected to and in common with collectors of Q2 and Q3 and to the parallel resistive network made up of resistors 36, 46 and 56. The base of transistor Q1 is connected to the cathode of a diode 32. The anode of diode 32 is connected to a resistor 30 which is in turn connected to the FCSRDRV1 terminal of the microcomputer. The emitter of Q1 is connected through a precision dropping resistor 34 with a resistance of approximately 5 ohms +1%. The other end of resistor 34 is connected to the portion of the crash sensor switch $CS_C$ that is electrically connected to ground.

When the proper command is issued on terminal FCSRDRV1, transistor Q1 is switched from its normally open state to a closed state. A closed Q1 completes a circuit which allows current to be injected through resistor 34 into the ground connection of crash sensor $CS_C$ and the common chassis ground return path of the vehicle and across any amount of resistance $R_{GC}$ that may be present at that connection. A microcomputer terminal FCSRAD1 is connected between the emitter of Q1 and resistor 34 in order to sense the voltage drop between that point and the common chassis ground return path.

Figure 2:
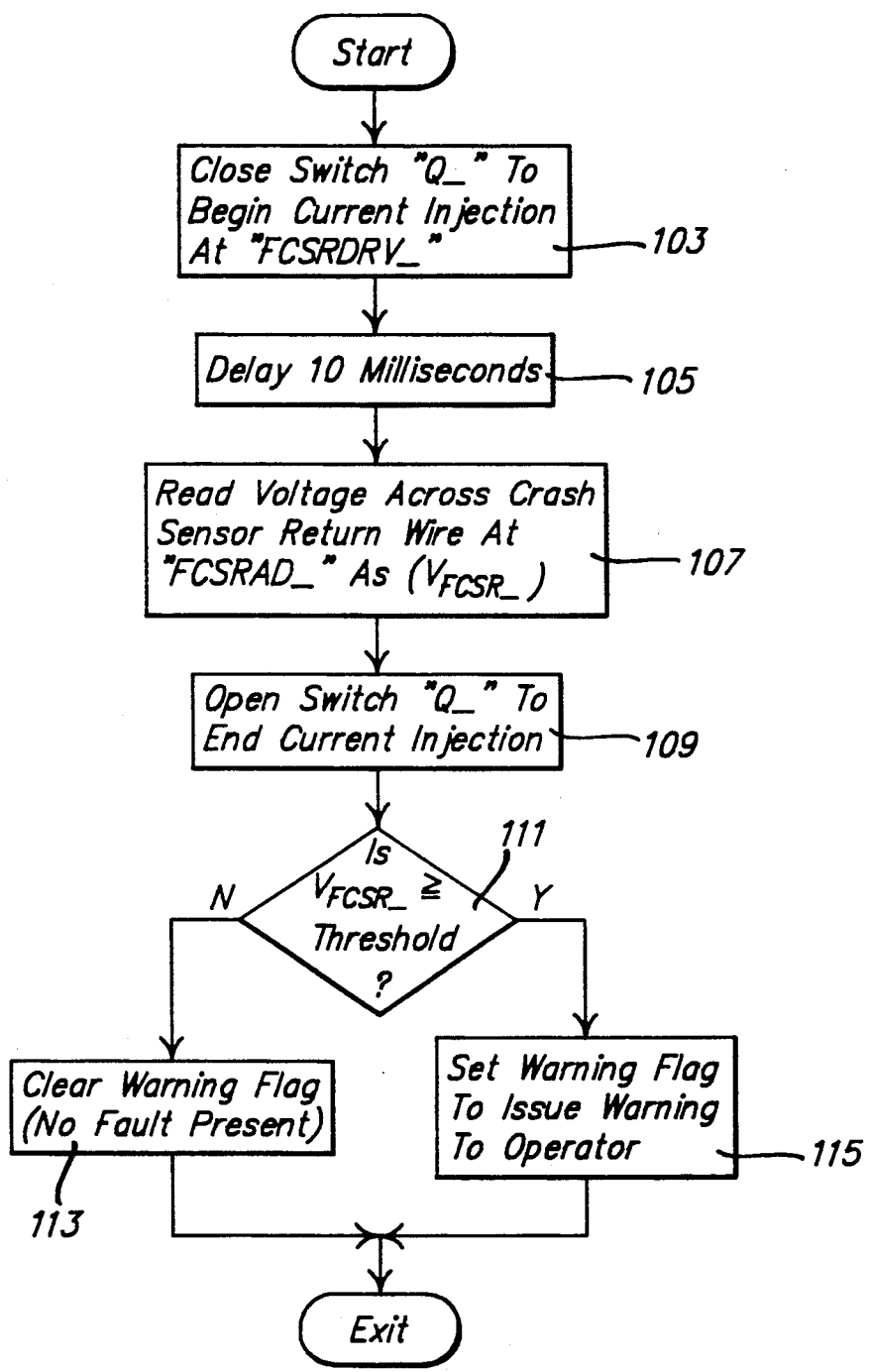
FIG. 2 constitutes a flow diagram of the method steps employed while performing the invention.

In operation, reference is made to FIG. 2 which provides a simplified flow chart of the steps followed by the associated programmed microcomputer in making the measurements necessary to perform the present invention. Starting at step 103, the command is given on the FCSRDRV1 terminal to close switch Q1 and begin the injection of current. In step 105, a 10 millisecond delay is provided to allow transient currents and their resulting voltages to stabilize. After the 10 millisecond delay in step 105, the voltage dropped across the crash sensor return wire is read at step 107 on the FCSRAD1 terminal connected to resistor 34 with respect to the microcomputer internal ground connection. That voltage is assigned the value $V_{FCSRI}$. After the voltage is read in step 107, Q1 is opened in step 109 in order to inhibit any further current flow through Q1 and resistor 34. In step 111, a determination is made as to whether the voltage $V_{FCSRI}$ is equal to or above a predetermined threshold. The predetermined threshold voltage is preferably set to reflect the voltage dropped due to the current flowing through the 5 ohm value of resistance 34 in series with a maximum 2 ohms resistance $R_{GC}$ at the ground connection. Therefore, if the voltage measured is less than that predetermined threshold value, a warning flag is cleared in step 113. If the measured voltage is above or equal to the threshold voltage, the warning flag is set in step 115 so that a warning light can be actuated to notify the operator of a fault in the system. The subroutine then exits and subsequent ground path return resistance measurements are made to the other crash sensors in an identical manner.

It will be apparent that many modifications and variations may be implemented without departing from the scope of the novel concept of this invention. Therefore, it is intended by the appended claims to cover all such modifications and variations which fall within the true spirit and scope of the invention.

We claim:

1. In an air bag restraint system for an automotive vehicle containing an explosive igniter that is responsive to electrical current of at least a predetermined minimum value for a predetermined period of time to inflate an air bag, and at least one crash sensor switch in electrical series between the igniter and a common vehicle ground connection, an apparatus for periodically checking the resistance value of the ground connection of the crash sensor, comprising:

means for applying an electrical current to the portion of said crash sensor switch that is electrically connected to ground; and means for measuring the voltage drop across the ground connection and determining if said measured voltage is above a predetermined maximum acceptable value.

2. An apparatus as in claim 1, wherein said current applying means includes a current source connected to a controllable normally open switch in series with a resistive element having a known value and to the portion of said crash sensor switch that is electrically connected to ground.

3. An apparatus as in claim 2, wherein said measuring means is connected to the junction between said normally open switch and said resistive element to measure the voltage drop between that junction and vehicle ground.

4. An apparatus as in claim 3, wherein said measuring means includes a microcomputer programmed to periodically close said normally open switch, measure the voltage drop across the known resistance and the grounded portion of said crash sensor switch, allow said normally open switch to open, and compare said measured voltage with a predetermined value.

5. In an air bag restraint system for an automotive vehicle containing an explosive igniter that is responsive to electrical current of at least a predetermined minimum value for a predetermined period of time to inflate an air bag, and at least one crash sensor switch in electrical series between the igniter and a common vehicle ground connection, a method of periodically checking the resistance value of the ground connection of the crash sensor, comprising the steps of:

applying an electrical current to the portion of said crash sensor switch that is electrically connected to ground; and measuring the voltage drop across the ground connection and determining if said measured voltage is above a predetermined maximum acceptable value.

6. A method as in claim 5, wherein said step of applying current includes the step of connecting a current source to a controllable normally open switch in series with a resistive element having a known value and to the portion of said crash sensor switch that is electrically connected to ground.

7. A method as in claim 6, wherein said step of measuring is performed at the junction between said normally open switch and said resistive element to measure the voltage drop between that junction and vehicle ground.

8. A method as in claim 7, wherein said step of applying current and measuring are performed with a microcomputer programmed to periodically close said normally open switch, measure the voltage drop across the known resistance and the grounded portion of said crash sensor normally open switch, allow said switch to open, and compare said measured voltage with a predetermined value.

* * * * *